United States Patent
Chen

(10) Patent No.: US 7,350,163 B2
(45) Date of Patent: Mar. 25, 2008

(54) SYSTEM AND METHOD FOR AUTOMATICALLY CALCULATING PARAMETERS OF AN MOSFET

(75) Inventor: Chun-jen Chen, Shenzhen (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/308,639

(22) Filed: Apr. 15, 2006

(65) Prior Publication Data

US 2007/0059886 A1    Mar. 15, 2007

(30) Foreign Application Priority Data

Sep. 15, 2005    (CN) .................... 200510037324.3

(51) Int. Cl.
*G06F 17/50* (2006.01)

(52) U.S. Cl. ............................................. 716/1; 716/2

(58) Field of Classification Search ................... 716/1, 716/2; 438/268; 257/328
See application file for complete search history.

(56) References Cited

U.S. PATENT DOCUMENTS

| | | | |
|---|---|---|---|
| 5,095,343 A * | 3/1992 | Klodzinski et al. | 257/328 |
| 5,838,022 A * | 11/1998 | Maeda | 257/48 |
| 6,637,930 B2 * | 10/2003 | Butchers et al. | 374/102 |
| 6,779,157 B2 * | 8/2004 | Kondo | 716/2 |
| 2004/0009643 A1 | 1/2004 | Blanchard | 438/268 |
| 2006/0236272 A1 * | 10/2006 | Chen | 716/1 |
| 2007/0004054 A1 * | 1/2007 | Orr | 438/10 |

OTHER PUBLICATIONS

Bendix, "Subtleties of SPICE Mosfet Parameter Extraction", Mar. 1989, IEEE 1989 International Conference on Microelectronic Test Structure, vol. 2, No. 1, pp. 65-68.*

* cited by examiner

*Primary Examiner*—Sun James Lin
(74) *Attorney, Agent, or Firm*—Wei Te Chung

(57) ABSTRACT

A system for automatically calculating parameters of an MOSFET is disclosed. The parameter calculating system runs in a computer. The parameter calculating system is used for receiving values inputted, and for calculating parameters of the MOSFET according to the input values. The parameter calculating system includes an operation selecting module (110), a value receiving module (120), a judging module (130), a parameter calculating module (140), and a circuit netlist generating module (150). A related method is also disclosed.

6 Claims, 7 Drawing Sheets

US 7,350,163 B2

SYSTEM AND METHOD FOR AUTOMATICALLY CALCULATING PARAMETERS OF AN MOSFET

FIELD OF THE INVENTION

The present invention relates to a system and method for automatically calculating parameters of an MOSFET.

DESCRIPTION OF RELATED ART

Metal-oxide-semiconductor field-effect transistors (MOSFETs) are widely used in the electronics industry for switching, amplification, filtering, and other tasks related to both analog and digital electrical signals. There are three electrodes of the MOSFET, that is: a gate, a drain and a source.

Conventionally, before building a model of the MOSFET, designers need to calculate parameters of the MOSFET one by one through lots of formulas. Manually calculation often leads to many mistakes resulting in inaccuracies of MOSFET models. Additionally, the manual calculation occupies a lot of time of the designers.

Furthermore, many power MOSFET models available today are based on an ideal lateral MOSFET device. They offer poor correlation between simulated and actual circuit performance in several areas. They have low and high current inaccuracies that could mislead power circuit designers. This situation is complicated by the dynamic performance of the model, especially for high-frequency applications of MOSFET models. In order to improve the accuracies of the MOSFET models, effects of the internal parasitic resistances and temperature coefficients of the MOSFETs must be taken into account. However, in conventional methods of building MOSFET models, the internal parasitic resistances and temperature coefficients are often not taken into account.

Therefore, what is needed is a system and method for automatically calculating parameters of an MOSFET, which can not only shorten time needed in calculating parameters of the MOSFET, but also take effects of internal parasitic resistances and temperature coefficients into account for improving the accuracy of an MOSFET model.

SUMMARY OF INVENTION

A computer-based system for automatically calculating parameters of an MOSFET in accordance with a preferred embodiment is provided. The parameter calculating system includes: an operation selecting module for selecting an operation; a value receiving module for receiving corresponding values; and a parameter calculating module for calculating the parameters of the MOSFET according to the input values by employing respective formula stored in a data storage device of the computer.

The system further includes a judging module for determining if the values inputted are valid.

In addition, the system further includes a circuit netlist generating module for generating a circuit netlist of the MOSFET according to the calculated parameters.

Furthermore, a preferred method for automatically calculating parameters of an MOSFET is also provided. The method includes the steps of: selecting to calculate direct current parameters and alternating current parameters; receiving corresponding values inputted; calculating the direct current parameters and the alternating current parameters; selecting to calculate temperature coefficients if the corresponding temperature coefficients are taken into account; receiving corresponding values inputted; and calculating the corresponding temperature coefficients.

The method further includes the steps of: receiving a nominal temperature; and generating a circuit netlist of the MOSFET according to all calculated parameters.

Other objects, advantages and novel features of the present invention will be drawn from the following detailed description of the preferred embodiment and preferred methods of the present invention with the attached drawings, in which:

DETAILED DESCRIPTION

In order to describe the preferred embodiments conveniently, the following technical terms are defined: Vgs: gate-source voltage; Id: drain current; Kp: transconduct parameter; Vt: threshold voltage; Rs: source resistance; Vd: forward voltage; Is: saturation current; Tj: junction temperature; Rds(on): drain-source on-state resistance; Rd: drain resistance; Qgs: gate-source charge; Crss: reverse transfer capacitance; Vds: drain-source voltage; Cgs: gate-source capacitance; Cjo: Crss at Vds=0V; M: grading coefficient; BVDSS: breakdown voltage; Coss: output capacitance; Dbody: body diode; Dbreak: breakdown diode; Dgd: gate-drain diode.

Figure 1:
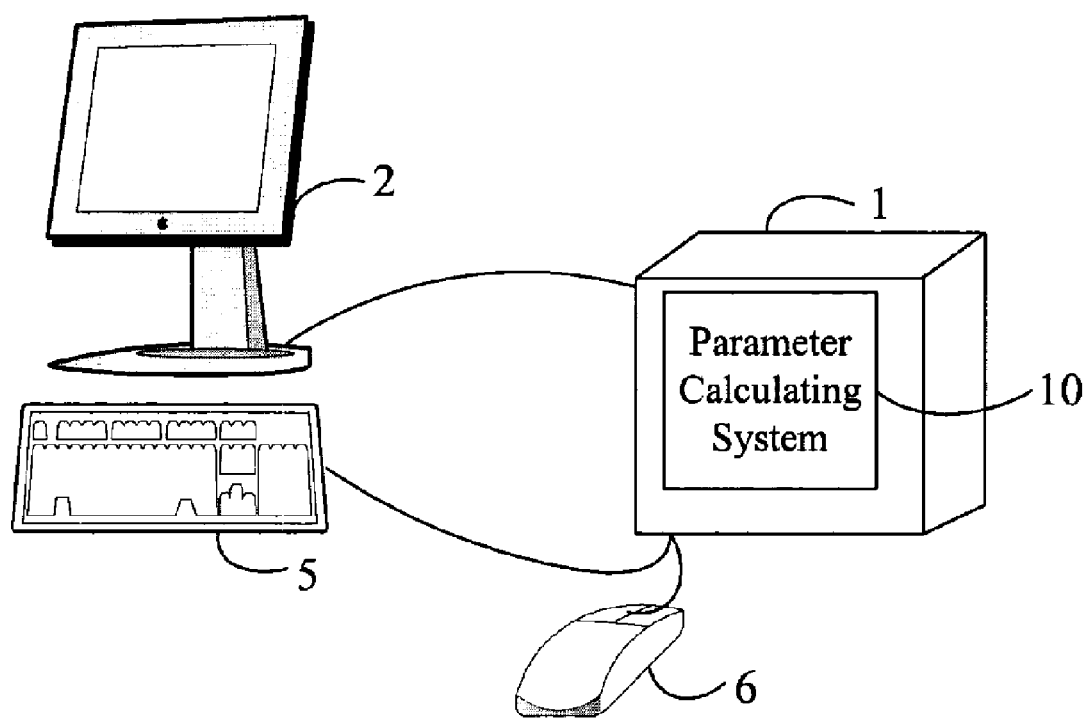
FIG. 1 is a schematic diagram of application environment for implementing a system for automatically calculating parameters of an MOSFET in accordance with a preferred embodiment.

FIG. 1 is a schematic diagram of an application environment for implementing a system for automatically calculating parameters of an MOSFET (hereinafter, "the parameter calculating system 10") in accordance with a preferred embodiment. The application environment typically includes a computer 1, a display 2 connected with the computer 1, a keyboard 5, and a mouse 6. Corresponding values may be inputted through the keyboard 5 or the mouse 6. The parameter calculating system 10 runs in the computer 1, and is used for receiving the corresponding values, and for calculating parameters of the MOSFET according to the inputted values. When calculating the parameters of the MOSFET, the parameter calculating system 10 employs corresponding formulas related to the MOSFET which are stored in a data storage device (not shown) of the computer 1.

Figure 2:
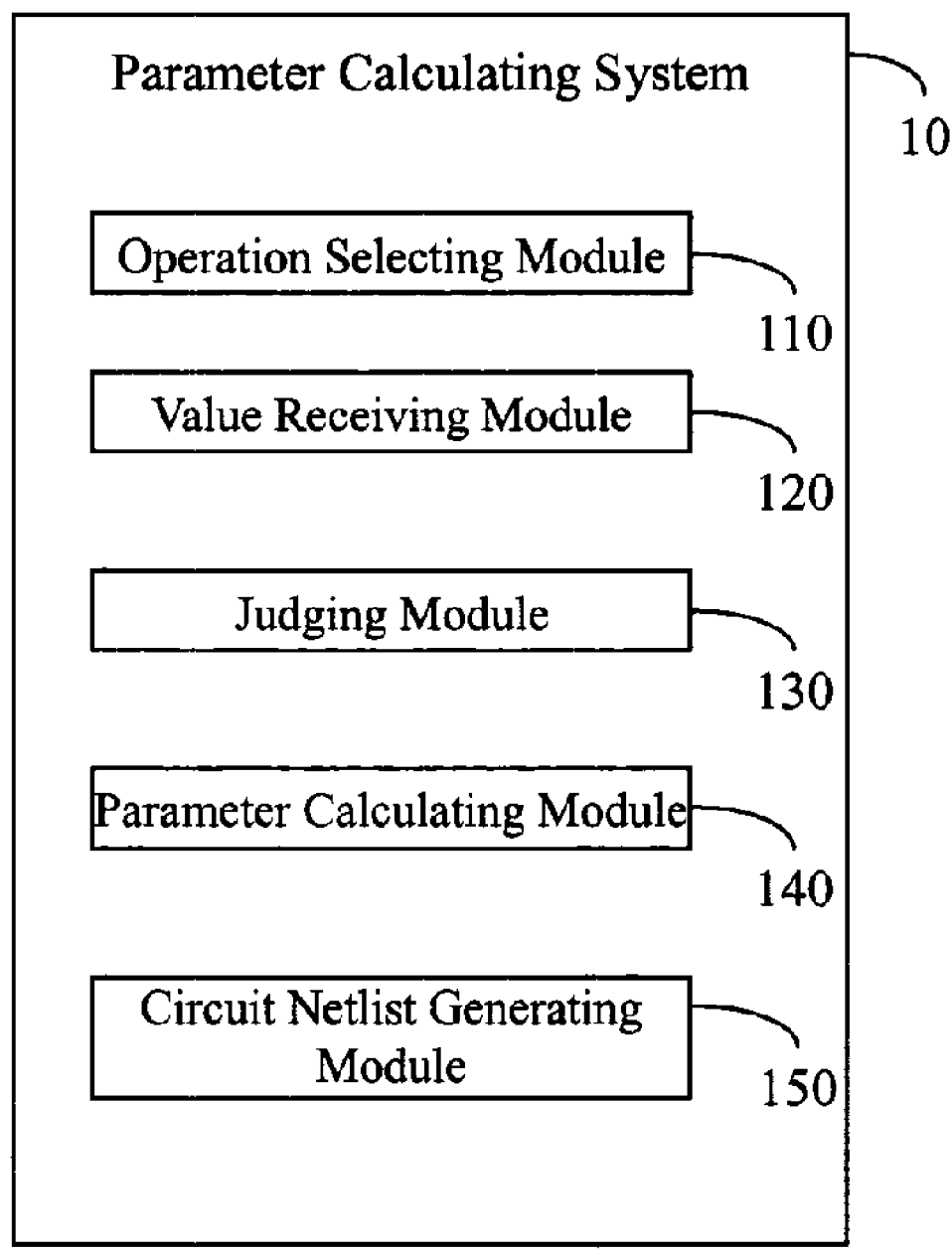
FIG. 2 is a schematic diagram showing function modules of the parameter calculating system of FIG. 1.

FIG. 2 is a schematic diagram showing function modules of the parameter calculating system 10. The parameter calculating system 10 includes an operation selecting module 110, a value receiving module 120, a judging module 130, a parameter calculating module 140, and a circuit netlist generating module 150. The operation selecting module 110 is for selecting an operation for an MOSFET. For example, selecting to calculate direct current parameters and alternating current parameters first, and then selecting to calculate corresponding temperature coefficients if needed. The value receiving module 120 is for receiving values inputted, these are needed for calculating parameters of the MOSFET. The values may include values of variables or variable sets as follows: (Vgs, Id), Vt, Tj, Rdson, Qgs, Crss, Vds, Coss,Rs, Kp, Rs, Vd, Is, Rd, Cgs, Cjo, M, BVDSS, and so on. The judging module 130 is for determining whether the values received are valid. For example, when a value received is not a number but a letter, the value may be considered invalid. The parameter calculating module 140 is for calculating the parameters of the MOSFET according to the values inputted. The parameters may include, for example, Kp, Vt, Rs, Rd, Is, Cjo, M, Cgs, and temperature coefficients of Vt, Rs, Rd, BVDSS, Vd and so on. The circuit netlist generating module 150 is for generating a circuit netlist of the MOSFET according to the calculated parameters. The circuit netlist can be inputted into Simulation Program with Integrated Circuits Emphasis (SPICE) software for constructing an MOSFET model for simulation.

Figure 3:
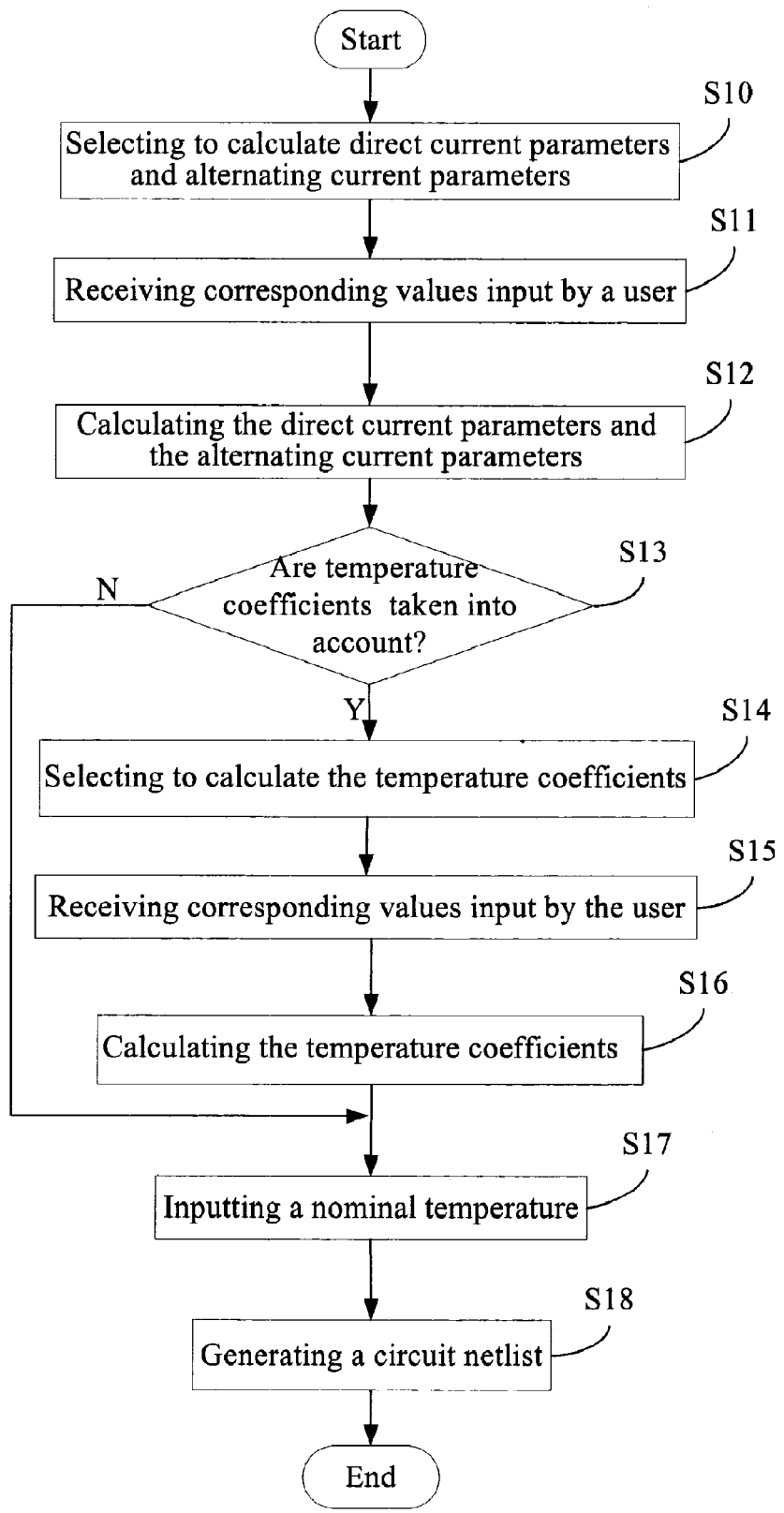
FIG. 3 is a flowchart of a preferred method for automatically calculating parameters of an MOSFET by utilizing the parameter calculating system of FIG. 1.

FIG. 3 is a flowchart of a preferred method for automatically calculating parameters of an MOSFET by utilizing the parameter calculating system 10 of FIG. 1. In step S10, a selection is made to calculate direct current parameters and alternating current parameters through the operation selecting module 110. In step S11, the value receiving module 120 receives corresponding values. In step S12, the parameter calculating module 140 calculates the direct current parameters and the alternating current parameters through corresponding formulas related to the MOSFET that are stored in a data storage device of the computer 1. In step S13, the judging module 130 determines whether corresponding temperature coefficients are taken into account. If no temperature coefficients are taken into account, the procedure goes directly to step S17 described below. Otherwise, if any temperature coefficients are taken into account, in step S14, a selection is made to calculate the temperature coefficients through the operation selecting module 110. In step S15, the value receiving module 120 receives corresponding values. In step S16, the parameter calculating module 140 calculates the temperature coefficients through corresponding formulas related to the MOSFET which are stored in the data storage device of the computer 1. In step S17, the value receiving module 120 receives a value of nominal temperature, which may be, for example, 25° C. In step S18, the circuit netlist generating module 150 generates a circuit netlist of the MOSFET according to all calculated parameters. The circuit netlist can be stored in the SPICE software for constructing an MOSFET model for simulation.

Figure 4A:
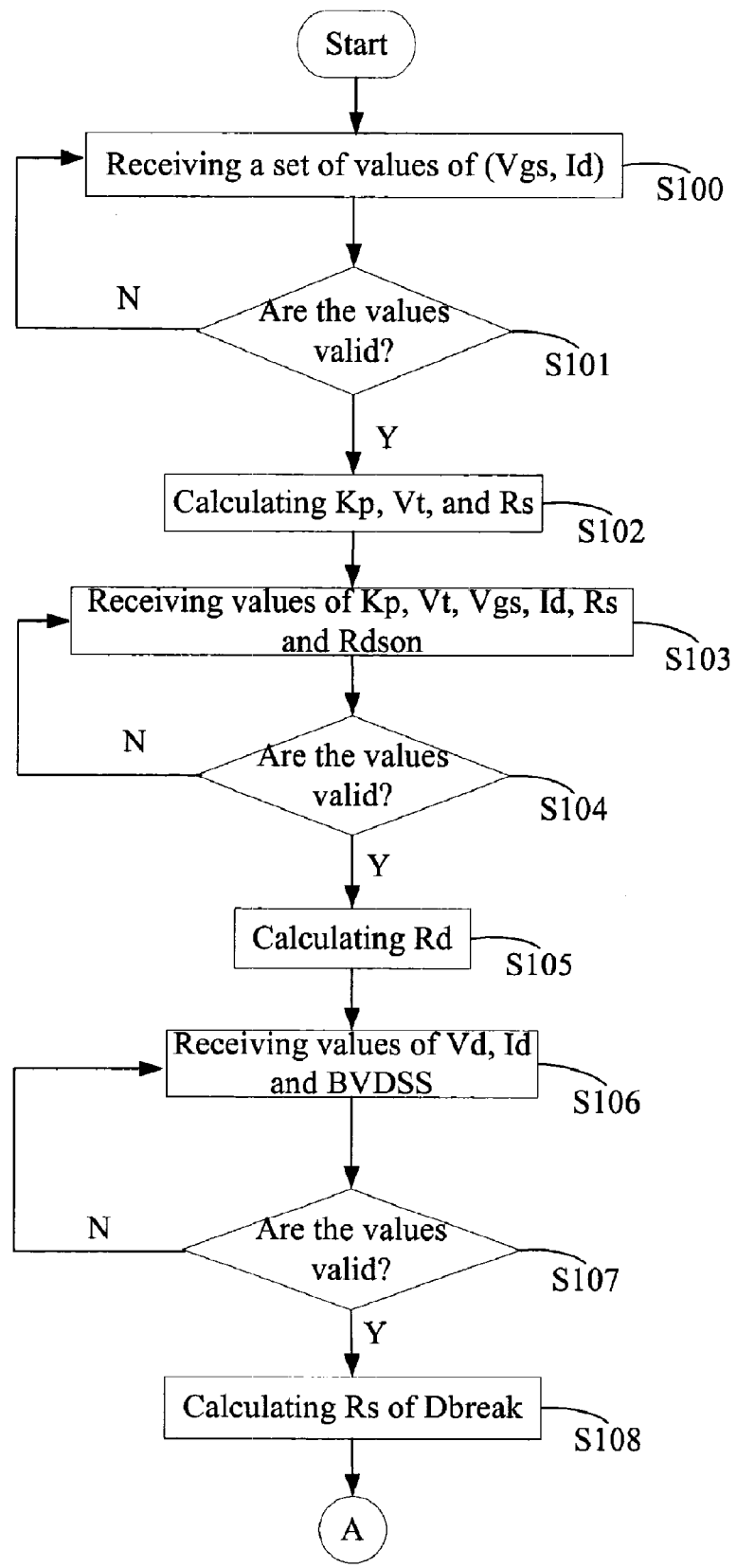
FIG. 4A and FIG. 4B in combination illustrate a step of FIG. 3 in detail, namely calculating direct current and alternating current.
Figure 4B:
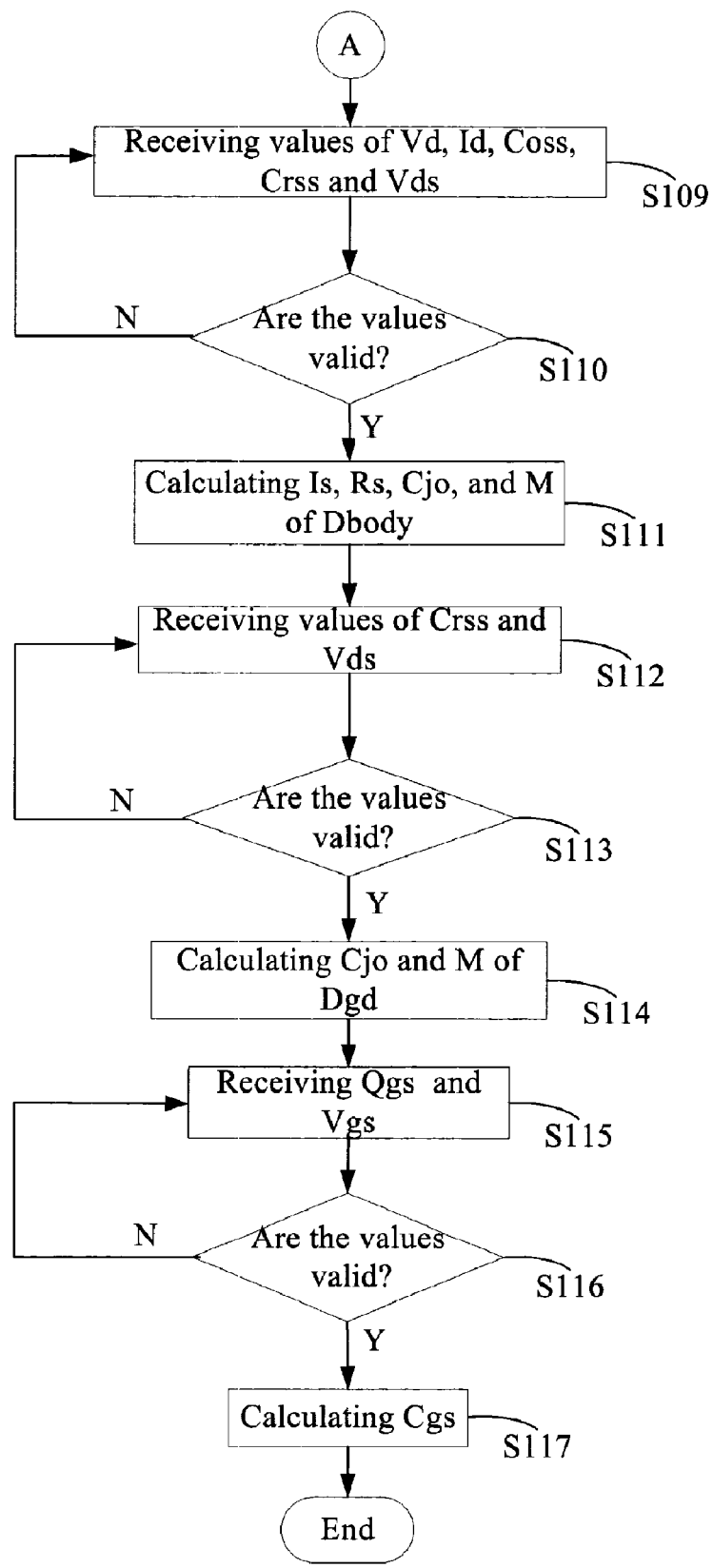

FIG. 4A and FIG. 4B in combination illustrate step S12 in detail, namely calculating the direct current parameters and the alternating current parameters. In step S100, the value receiving module 120 receives a set value (Vgs, Id). In step S101, the judging module 130 determines whether the values received are valid. If the values received are valid, in step S102, the parameter calculating module 140 calculates values of Kp, Vt and Rs. In step S103, the value receiving module 120 receives values of Kp, Vt, Vgs, Id, Rs and Rdson. In step S104, the judging module 130 determines whether the values received are valid. If the values received are valid, in step S105, the parameter calculating module 140 calculates the value of Rd. In step S106, the value receiving module 120 receives values of Vd, Id and BVDSS. In step S107, the judging module 130 determines whether the values received are valid. If the values received are valid, in step S108, the parameter calculating module 140 calculates the value of Rs of Dbreak. In step S109, the value receiving module 120 receives values of Vd, Id, Coss, Crss and Vds. In step S110, the judging module 130 determines whether the values received are valid. If the values received are valid, in step S111, the parameter calculating module 140 calculates values of Is, Rs, Cjo, and M of Dbody. In step S112, the value receiving module 120 receives values of Crss and Vds. In step S113, the judging module 130 determines whether the values received are valid. If the values received are valid, in step S114, the parameter calculating module 140 calculates values of Cjo and M of Dgd. In step S115, the value receiving module 120 receives values of Qgs and Vgs. In step S116, the judging module 130 determines whether the values received are valid. If the values received are valid, in step S117, the parameter calculating module 140 calculates the value of Cgs.

In each of the above-mentioned steps, if the judging module 130 determines whether any values received are invalid, the procedure returns to its last step.

Figure 5A:
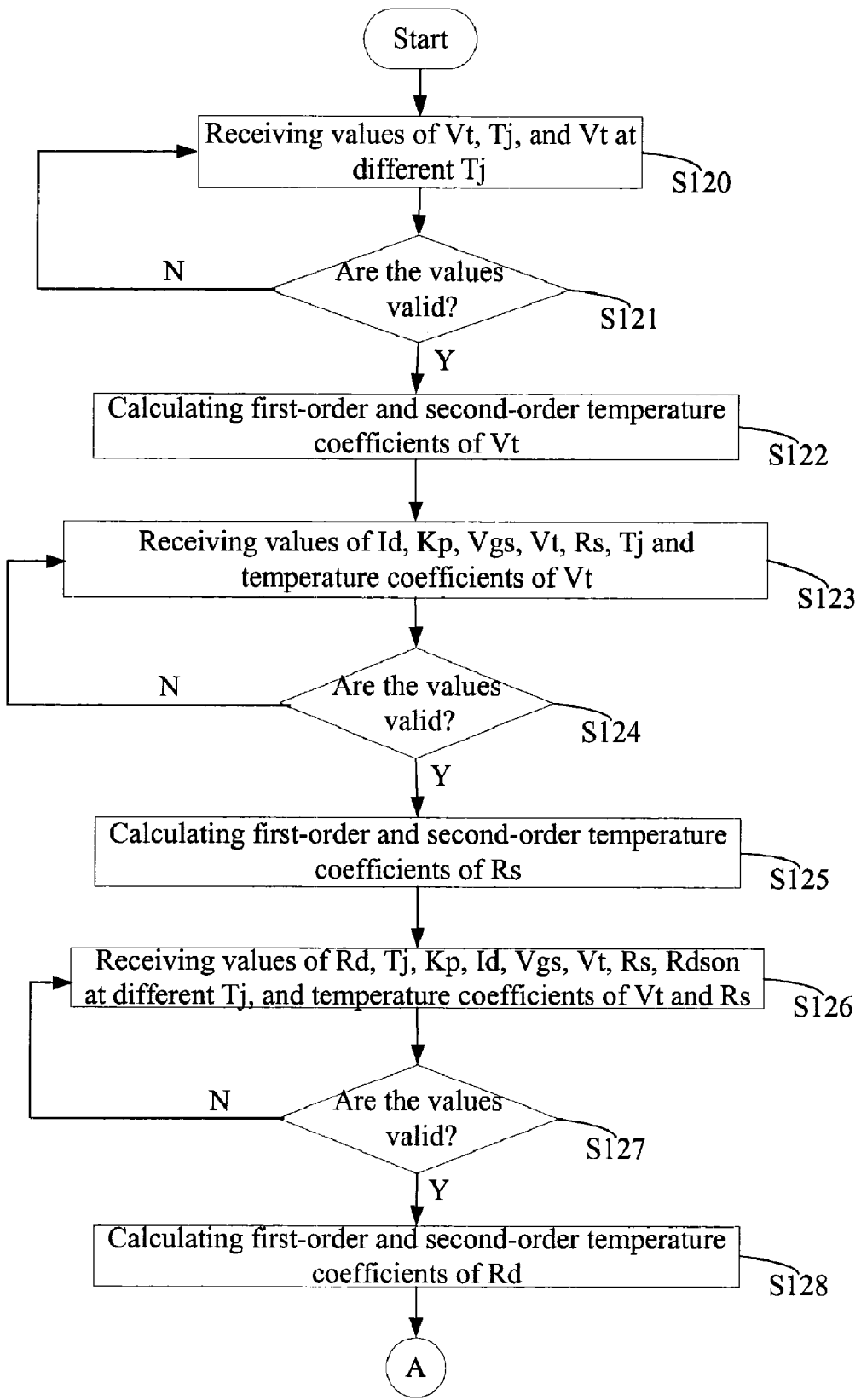
FIG. 5A and FIG. 5B in combination illustrate another step of FIG. 3 in detail, namely calculating corresponding temperature coefficients.
Figure 5B:
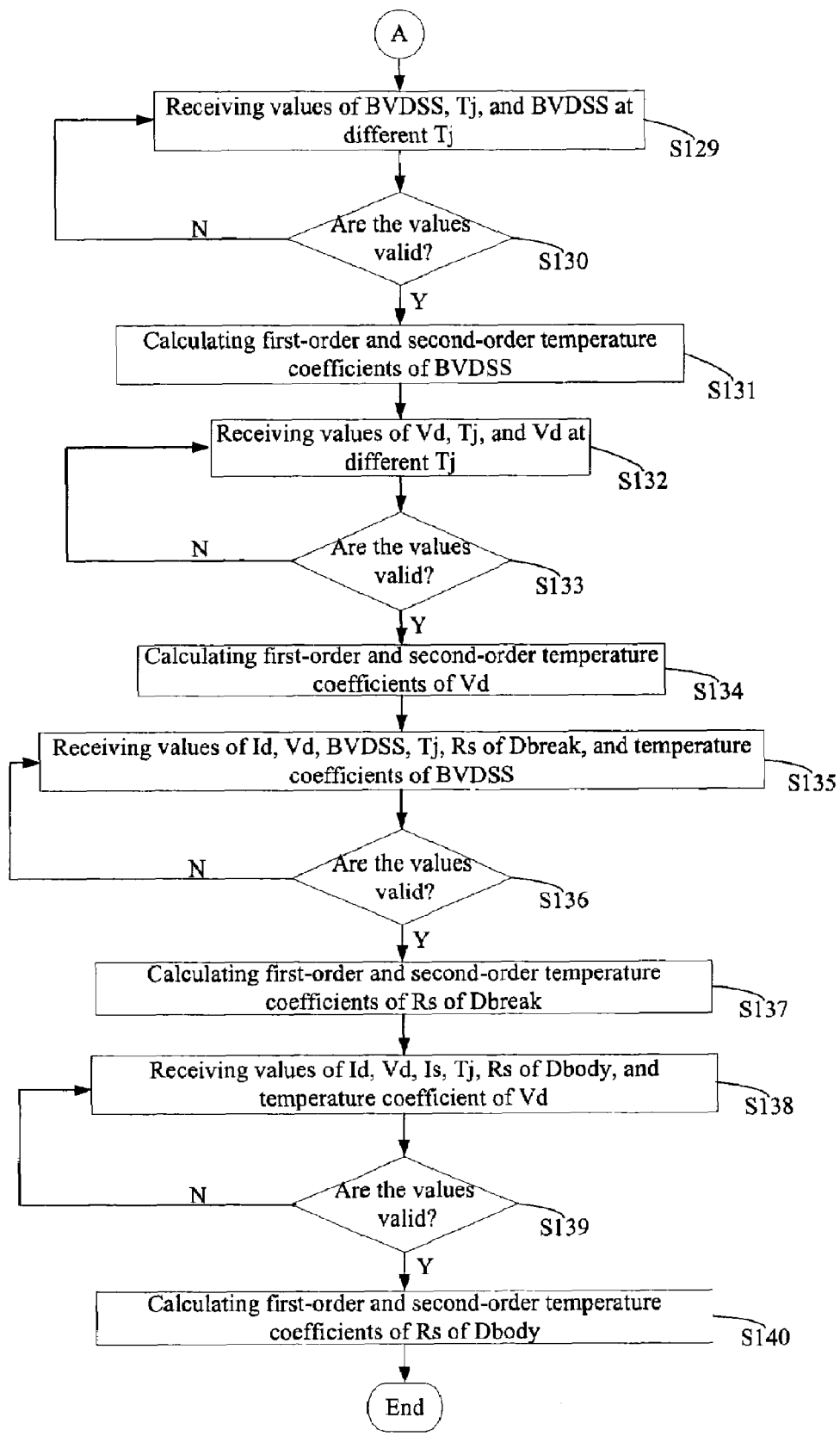

FIG. 5A and FIG. 5B in combination illustrate step S16 in detail, namely calculating the corresponding temperature coefficients. In step S120, the value receiving module 120 receives values of Vt, Tj, and Vt at different Tj. In step S121, the judging module 130 determines whether the values received are valid. If the values received are valid, in step S122, the parameter calculating module 140 calculates first-order and second-order temperature coefficients of Vt. In step S123, the value receiving module 120 receives values of Id, Kp, Vgs, Vt, Rs, Tj and temperature coefficient of Vt. In step S124, the judging module 130 determines whether the values received are valid. If the values received are valid, in step S125, the parameter calculating module 140 calculates first-order and second-order temperature coefficients of Rs. In step S126, the value receiving module 120 receives values of Rd, Tj, Kp, Id, Vgs, Vt, Rs, Rdson at different Tj, and temperature coefficients of Vt and Rs. In step S127, the judging module 130 determines whether the values received are valid. If the values received are valid, in step S128, the parameter calculating module 140 calculates first-order and second-order temperature coefficients of Rd. In step S129, the value receiving module 120 receives values of BVDSS, Tj, and BVDSS at different Tj. In step S130, the judging module 130 determines whether the values received are valid. If the values received are valid, in step S131, the parameter calculating module 140 calculates first-order and second-order temperature coefficients of BVDSS. In step S132, the value receiving module 120 receives values of Vd, Tj, and Vd at different Tj. In step S133, the judging module 130 determines whether the values received are valid. If the values received are valid, in step S134, the parameter calculating module 140 calculates first-order and second-order temperature coefficients of Vd. In step S135, the value receiving module 120 receives values of Id, Vd, BVDSS, Tj, Rs of Dbreak, and temperature coefficient of BVDSS. In step S136, the judging module 130 determines whether the values received are valid. If the values received are valid, in step S137, the parameter calculating module 140 calculates first-order and second-order temperature coefficients of Rs of Dbreak. In step S138, the value receiving module 120 receives values of Id, Vd, Is, Tj, Rs of Dbody, and temperature coefficient of Vd. In step S139, the judging module 130 determines whether the values received are valid. If the values received are valid, in step S140, the parameter calculating module 140 calculates first-order and second-order temperature coefficients of Rs of Dbody.

In each of the above-mentioned steps, if the judging module 130 determines whether any values received are invalid, the procedure returns to its last step.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A computer-based system for automatically calculating parameters of a metal-oxide-semiconductor field-effect transistor (MOSFET), the computer-based system comprising:
    an operation selecting module for selecting an operation, wherein the operation comprises at least calculating direct current parameters and alternating current parameters, and selectively further comprises calculating corresponding temperature coefficients;
    a value receiving module for receiving corresponding input values; and
    a parameter calculating module for calculating the parameters of the MOSFET according to the input values by employing respective formulas stored in a data storage device of a computer, wherein:
    the parameters of the MOSFET comprise the direct current parameters, the alternating current parameters, and the corresponding temperature coefficients if the operation of calculating corresponding temperature coefficients is selected; and
    the corresponding temperature coefficients comprise first-order and second-order temperature coefficients of threshold voltage.

2. The computer-based system according to claim 1, further comprising judging module for determining whether the input values received are valid.

3. The computer-based system according to claim 1, further comprising a circuit netlist generating module for generating a circuit netlist of the MOSFET according to the calculated parameters of the MOSFET.

4. A computer-based method for automatically calculating parameters of a metal-oxide-semiconductor field-effect transistor (MOSFET), the computer-based method comprising steps of:
    selecting to calculate direct current parameters and alternating current parameters;
    receiving corresponding values;
    calculating the direct current parameters and the alternating current parameters;
    selecting to calculate temperature coefficients if corresponding temperature coefficients are taken into account;
    receiving corresponding values;
    receiving nominal temperatures for use in calculation of the corresponding temperature coefficients;
    calculating the corresponding temperature coefficients; and
    generating a circuit netlist of the MOSFET according to all the calculated parameters.

5. The computer-based method according to claim 4, wherein the step of calculating the direct current parameters and the alternating-current parameters comprises steps of:
    receiving a set of values of gate-source voltage and of drain current, of the MOSFET;
    calculating values of transconduct parameter, threshold voltage, and source resistance, of the MOSFET;
    receiving values of transconduct parameter, threshold voltage, gate-source voltage, drain current, source resistance, and drain-source on-state resistance, of the MOSFET;
    calculating a value of drain resistance of the MOSFET;
    receiving values of forward voltage, drain current, and breakdown voltage, of a breakdown diode of the MOSFET;
    calculating a value of source resistance of the breakdown diode;
    receiving values of forward voltage, drain current, output capacitance, reverse transfer capacitance, and drain-source voltage, of a body diode of the MOSFET;
    calculating values of saturation current, source resistance, reverse transfer capacitance at drain-source voltage=0V, and grading coefficient, of the body diode;
    receiving values of reverse transfer capacitance, and drain-source voltage, of a gate-drain diode of the MOSFET;
    calculating values of reverse transfer capacitance at drain-source voltage=0V, and grading coefficient, of the gate-drain diode;
    receiving values of gate-source charge, and gate-source voltage, of the MOSFET; and
    calculating a value of gate-source capacitance of the MOSFET.

6. The computer-based method according to claim 4, wherein the step of calculating the corresponding temperature coefficients comprises steps of:
    receiving values of threshold voltage, junction temperature, and threshold voltage at different junction temperatures, of the MOSFET;
    calculating first-order and second-order temperature coefficients of threshold voltage of the MOSFET;
    receiving values of drain current, transconduct parameter, gate-source voltage, threshold voltage, source resistance, junction temperature, and temperature coefficient of threshold voltage, of the MOSFET;
    calculating first-order and second-order temperature coefficients of source resistance of the MOSFET;
    receiving values of drain resistance, junction temperature, transconduct parameter, drain current, gate-source voltage, threshold voltage, source resistance, drain-source on-state resistance at different junction temperatures, temperature coefficient of threshold voltage, and temperature coefficient of source resistance, of the MOSFET;
    calculating first-order and second-order temperature coefficients of drain resistance of the MOSFET;
    receiving values of breakdown voltage, junction temperature, and breakdown voltage at different junction temperatures of the MOSFET;
    calculating first-order and second-order temperature coefficients of breakdown voltage of the MOSFET;
    receiving values of forward voltage, junction temperature, and forward voltage at different junction temperatures, of a body diode of the MOSFET;
    calculating first-order and second-order temperature coefficients of forward voltage of the body diode;
    receiving values of drain current, forward voltage, breakdown voltage, junction temperature, source resistance, and temperature coefficient of breakdown voltage, of a breakdown diode of the MOSFET;
    calculating first-order and second-order temperature coefficients of source resistance of the breakdown diode;

receiving values of drain current, forward voltage, saturation current, junction temperature, source resistance, and temperature coefficient of forward voltage, of the body diode; and calculating first-order and second-order temperature coefficients of source resistance of the body diode.

* * * * *